(12) United States Patent
Duret et al.

(10) Patent No.: US 11,598,825 B2
(45) Date of Patent: Mar. 7, 2023

(54) SYSTEM FOR DETERMINING AT LEAST ONE ROTATION PARAMETER OF A ROTATING MEMBER

(71) Applicant: NTN-SNR ROULEMENTS, Annecy (FR)

(72) Inventors: Christophe Duret, Bluffy (FR); Cécile Flammier, Annecy (FR); Etienne Vandamme, Alleves (FR)

(73) Assignee: NTN-SNR Roulements, Annecy (FR)

( * ) Notice: Subject to any disclaimer, the term of this patent is extended or adjusted under 35 U.S.C. 154(b) by 201 days.

(21) Appl. No.: 16/816,679

(22) Filed: Mar. 12, 2020

(65) Prior Publication Data
US 2020/0292634 A1    Sep. 17, 2020

(30) Foreign Application Priority Data

Mar. 12, 2019  (FR) ..................................... 19 02523

(51) Int. Cl.
*G01R 5/14* (2006.01)
*G01R 33/09* (2006.01)
*G01D 5/245* (2006.01)

(52) U.S. Cl.
CPC ......... *G01R 33/091* (2013.01); *G01D 5/2451* (2013.01)

(58) Field of Classification Search
CPC ...... G01R 33/091; G01R 33/07; G01R 33/09; G01R 33/093; G01R 33/096; G01R 33/098; G01D 5/245; G01D 5/244; G01D 5/14; G01D 5/2451; G01D 5/24438; G01D 5/145; H03M 1/645; H03M 1/00; H03M 1/22; H03M 1/26; H03M 1/301; H03M 1/305; H03M 1/485; H03M 1/0617; H03M 1/1066; H03M 1/143; H03M 1/161; H03M 1/30; H03M 1/303; H03M 1/308; H03M 1/50;
(Continued)

(56) References Cited

U.S. PATENT DOCUMENTS

2017/0292855 A1* 10/2017 Kaste ..................... G01D 5/142
2020/0408856 A1* 12/2020 Schweizer ............. G01D 5/145

FOREIGN PATENT DOCUMENTS

JP    200397971 A    10/2004
WO   2004083881 A1    9/2004
(Continued)

*Primary Examiner* — Son T Le
(74) *Attorney, Agent, or Firm* — Murtha Cullina LLP

(57) ABSTRACT

The invention relates to a system comprising a coder that has an alternation of North and South magnetic poles separated by transitions extending along a helix of pitch p and of angle α, the magnetic track having $N_{pp}$ pairs of North and South poles and a polar width $L_p$ measured along a normal to the transitions which are: $N_{pp}=\pi a/l$ and $L_p = p \cdot \cos \alpha$. The invention also includes at least one sensor able to detect the rotating magnetic field in a plane perpendicular to the magnetic track and to the transitions by means of a mounting of at least two sensitive magnetic elements. The mounting being disposed at a radial reading distance from the magnetic track and being arranged to deliver signals in quadrature.

6 Claims, 3 Drawing Sheets

(58) Field of Classification Search
CPC ......... H03M 1/64; H02K 24/00; H02K 11/21; H02K 7/003
See application file for complete search history.

(56) References Cited

FOREIGN PATENT DOCUMENTS

| WO | 2006064169 A2 | 6/2006 |
|---|---|---|
| WO | 2018051011 A1 | 3/2018 |

* cited by examiner

SYSTEM FOR DETERMINING AT LEAST ONE ROTATION PARAMETER OF A ROTATING MEMBER

CROSS-REFERENCE TO RELATED APPLICATION

This application claims the priority of French patent application number 19 02523, filed on Mar. 12, 2019, the entire contents of which are incorporated herein by reference.

TECHNICAL FIELD

The invention relates to a system for determining at least one rotation parameter of a rotating member, the system comprising a coder emitting a periodic magnetic field as well as a sensor able to detect said magnetic field.

BACKGROUND

In many applications, it is desired to know in real-time and with optimum quality at least one rotation parameter of a rotating member, such as its position, its speed, its acceleration or its direction of movement.

To do this, document WO-2006/064169 proposes the use of a coder intended to be integral with the mobile member and whereon a magnetic track is formed which is able to emit a pseudo-sinusoidal magnetic field at a reading distance from a sensor comprising several sensitive elements.

Advantageously, each sensitive element can comprise at least one pattern with a Tunnel Magneto Resistance (TMR) material base of which the resistance varies according to the magnetic field detected, as described for example in document WO-2004/083881.

To determine a movement parameter of the mobile member according to the change in the magnetic field detected, document WO-2006/064169 provides a combination of the signals representing the resistance of each one of the sensitive elements to deliver two signals in quadrature and of the same amplitude which can be used to calculate the parameter.

Document WO-2018/051011 proposes a system for determining in which the track of the coder has an alternation of North and South magnetic poles separated by transitions with each one extending along an Archimedean spiral. In relation with an axial reading of the magnetic field delivered by the coder, this embodiment makes it possible to dissociate the number of magnetic poles, the width of the latter and the diameter of the coder. It is thus possible to have few poles while still having magnetic signals with good sinusoidality.

Moreover, some applications require a radial reading of the magnetic field delivered by the coder, due to constraints concerning the space available. To do this, coders are known comprising a body that has a cylindrical periphery on which the magnetic track is formed, the track having magnetic transitions aligned with the axis of rotation.

In this embodiment, the width of the poles is the ratio of the circumference to the number of poles, which gives rise to a problem with coders with a low number of pairs of poles, typically less than 6, since the polar width becomes substantial, of about ten millimetres.

These wide poles deliver a magnetic signal of which the sinusoidality is poor with a low read gap, becoming rich in odd harmonics, improper for precise angle measurement, requiring moving away from sensitive elements of the magnetic track, which goes against the amplitude of the signal and therefore good detection thereof by the sensitive elements.

In addition, wide poles require a thickness of the coder which is also more substantial to preserve a sinusoidality and an amplitude that are sufficient for the magnetic signal. This is not favourable to the integration of the coder in small areas and complicates the method of magnetisation, because a greater thickness of material has to be saturated magnetically.

We also know from document JP-2003-97971 a system in which two sensors are arranged with respect to a magnetic track for measuring the same unidirectional component of a magnetic field at two locations, the locations being determined so that the signals delivered by the sensors are in quadrature.

The invention aims to perfect prior art by proposing a system for determining with radial reading of the magnetic field delivered by a coder, wherein the compromise between the periodicity and the amplitude of the magnetic field detected can be satisfied without inducing any specific size constraints for the coder, and this in relation with a magnetic coder with a low number of pairs of poles.

The coder with radial reading according to the invention is such that the polar width of each one of the poles is independent of the number of pairs of poles, thus being able to reconcile a low number of pairs of poles with an adequate positioning of the sensitive elements relatively to the sinusoidality and to the amplitude of the magnetic field to be detected.

To this effect, the invention proposes a system for determining at least one rotation parameter of a rotating member, the system comprising:
  a coder intended to be associated rotationally with the rotating member in such a way as to move jointly with it, the coder comprising a body having a cylindrical periphery with a radius around an axis of revolution, the periphery having an alternation of North and South magnetic poles of width l which are separated by transitions, each one of the transitions extending along an helix of pitch p and of angle α so as to form a multipolar magnetic track which is able to emit a periodic magnetic field which is rotating in a plane perpendicular to the magnetic track and to the transitions, the track having $N_{pp}$ pairs of North and South poles and a polar width $L_p$ measured along a normal to the transitions which are such that: $N_{pp}=\pi a/l$ and $L_p=p\cdot\cos\alpha$;
  at least one sensor able to detect the rotating magnetic field emitted by the coder by means of a mounting of at least two sensitive magnetic elements, the mounting being disposed at a radial reading distance from the magnetic track and being arranged to deliver signals in quadrature.

BRIEF DESCRIPTION OF THE DRAWINGS

Other particularities and advantages of the invention shall appear in the following description, made in reference to the accompanying figures, wherein.

DETAILED DESCRIPTION

In relation with these figures, a system for determining at least one rotation parameter of a rotating member with respect to a fixed structure is described. The parameter of the rotating member can be selected from its position, its speed, its direction of rotation, its acceleration or its direction of movement, axial in particular.

In one embodiment, the system can be used in relation with the controlling of a brushless direct current electric motor, making it possible to know the absolute angular position on a pair of motor poles of the rotor with respect to the stator.

The system for determining comprises a coder 1 intended to be integral with the rotating member in such a way as to move jointly with it, the coder comprising a body having a cylindrical periphery with a radius around an axis of revolution X on which is formed a magnetic track 2 which is able to emit a periodic magnetic field representative of the rotation of the coder. The magnetic field emitted can be sinusoidal or pseudo-sinusoidal, i.e. having at least one portion which can be correctly approximated by a sinusoid.

The track 2 has an alternation of North $2n$ and South $2s$ magnetic poles of width l which are separated by transitions 3, each one of the transitions extending along a helix of pitch p and of angle α.

Thus, the magnetic track has $N_{pp}$ pairs of North and South poles and a polar width $L_p$ measured along a normal N to the transitions 3 which are such that: $N_{pp}=\pi a/l$ and $L_p=p\cdot\cos\alpha$. The magnetic track 2 delivers a pseudo-sinusoidal magnetic signal of which the spatial period along the normal N is equal to $\lambda=2\cdot L_p$. The periodic magnetic field delivered by the magnetic track 2 is rotating in a plane perpendicular to the magnetic track and to the transitions 3.

The magnetic field generated by the coder 1 on a pair of magnetic poles $2n$, $2s$ is the combination of a perfect fundamental sinusoidal component that is sought to be measured in order to determine the parameter, and of several odd-order harmonics (3, 5, etc.).

If it is assumed that the coder 1 rotates at a constant speed of rotation ω, the magnetic field can be written in the following way:

$H(t)=H_1\cdot\sin\omega t+H_3\cdot\sin 3\omega t+H_5\cdot\sin 5\omega t+ \ldots$ The amplitude $H_3$ of the $3^{rd}$ order harmonic can typically represent 5% of the amplitude $H_1$ of the fundamental. According to the position of the sensor and the reading distance, this proportion of the amplitude $H_3$ of the $3^{rd}$ order harmonic can be much higher.

Figure 1A:
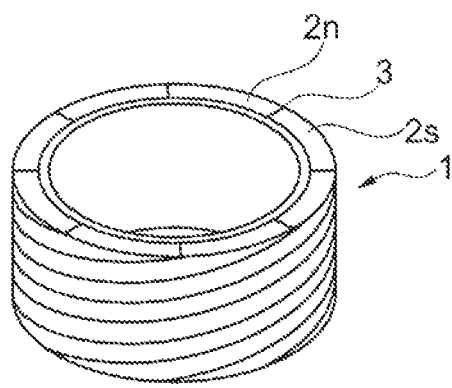
FIG. 1a and FIG. 1b diagrammatically show a coder of a system for determining according to the invention, respectively in perspective (FIG. 1a) and as a side view (FIG. 1b)
Figure 1B:
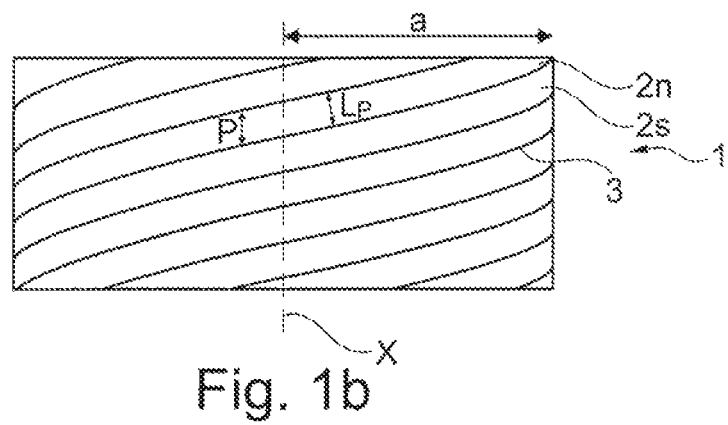
Figure 2:
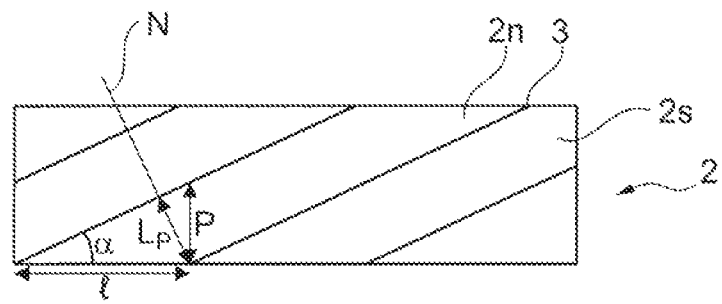
FIG. 2 is a flat representation of the cylindrical periphery of the coder of FIGS. 1a and 1b.

The helical geometry of the magnetic track 2 makes it possible for the number $N_{pp}$ of pairs of poles $2n$, $2s$ as well as the polar width $L_p$ to be chosen independently of the radius a of the magnetic track 2. In relation with FIGS. 1a and 1b, the coder 1 comprises four pairs of poles $2n$, $2s$, which is particularly suitable for the controlling of an electric motor with four pairs of poles, the system providing the absolute position on a pair of motor poles, i.e. 90° mechanical.

According to an embodiment, the coder 1 is formed from a magnet on the cylindrical periphery of which the multipolar magnetic track 2 is carried out. The magnet can be formed from an annular matrix, for example made from a base of a plastic or elastomer material, in which magnetic particles are dispersed, particles of ferrite or of rare earths such as NdFeB.

The system for determining comprises at least one sensor that is intended to be integral with the fixed structure, the sensor being able to detect the rotating magnetic field emitted by the coder 1. To do this, the sensor comprises a mounting 4 of at least two sensitive magnetic elements 5, the mounting being disposed at a radial reading distance from the magnetic track 2 in order to deliver signals in quadrature which are representative of the rotation of the coder 1.

Each one of the sensitive elements 5 can be chosen from magnetically sensitive probes. For example, Hall, tunnel magneto resistance (TMR), anisotropic magneto resistance (AMR) or giant magneto resistance (GMR) probes can measure each one of the two components of the magnetic field (normal and tangential to the coder 1).

As described in document WO-2004/083881, each element 5 forms a tunnel junction by comprising a stack of a reference magnetic layer, of an insulating separation layer and of a magnetic layer that is sensitive to the field to be detected, the resistance of the stack being according to the relative orientation of the magnetisation of the magnetic layers.

Advantageously, each sensitive element 5 can comprise at least one pattern with a magneto resistance material base, with a tunnel effect, of which the resistance varies according to the magnetic field, a sensitive element 5 being able to comprise a single motif or a group of motifs connected in series or in parallel.

In order to be able to determine the rotation parameter of the rotating member, the signals delivered by the mounting 4 of sensitive elements 5 must preferably be in quadrature, i.e. geometrically offset by 90° divided by $N_{pp}$. By using such signals in quadrature, in the sensor or in an associated calculator, it is known to determine the angular position of the coder 1, for example through a direct calculation of an arctangent function, using a Look-Up Table (LUT) or a method of the CORDIC type.

Figure 4:
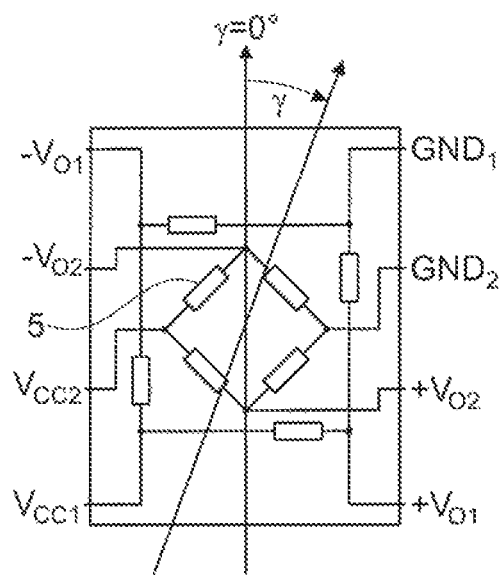
FIG. 4 is a diagram of a mounting of sensitive elements according to an embodiment of the invention.

To do this, in relation with FIG. 4, the mounting 4 can comprise two Wheatstone bridge circuits of four sensitive elements 5, the circuits being disposed in a plane perpendicular to the magnetic track 2 in such a way as to detect the magnetic field rotating in the plane which is emitted by the track.

Figure 5:
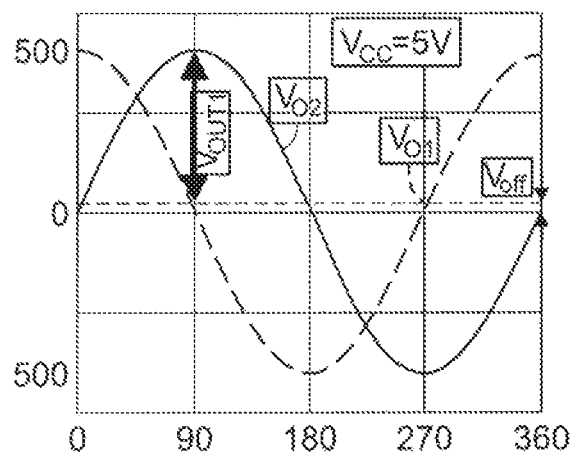
FIG. 5 shows signals in quadrature delivered by the mounting according to FIG. 4.

According to the angle γ of inclination of the magnetic field, FIG. 5 shows the signals $V_{O1}$ and $V_{O2}$ delivered in quadrature by the bridge which are such that:

$V_{O1}=(+V_{O1})-(-V_{O1});$ $V_{O2}=(+V_{O2})-(-V_{O2}).$

In relation with an application of the system in controlling an electric motor, the good sinusoidality of the signal delivered to the control calculator allows for:
- better performance, in particular at start-up, for example the time for reaching the speed or position setting;
- a more "gentle" operation, without torque shifts in steady state;
- less energy consumption;
- a lower operating temperature;
- a more substantial maximum torque.

Figure 3:
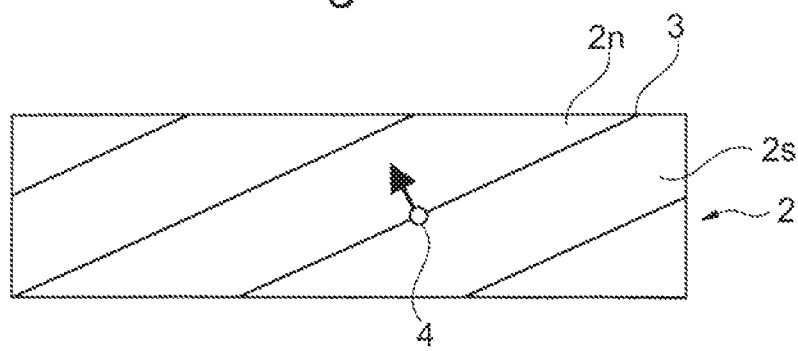
FIG. 3 diagrammatically shows an embodiment of the arrangement at a radial reading distance of a mounting of sensitive elements with respect to a coder according to the invention.

FIG. 3 shows a mounting 4 in the median position of the periphery of the coder 1 in order to be separated as much as possible from the edges of the coder.

Figure 6:
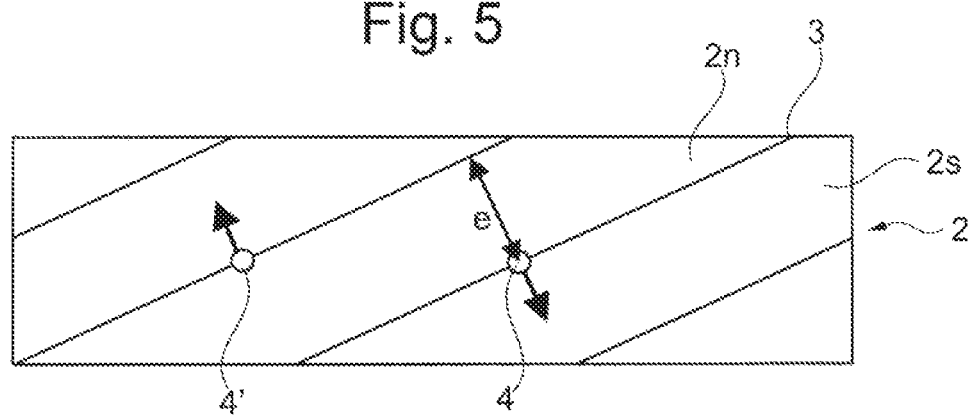
FIG. 6 diagrammatically shows an embodiment of the arrangement at a radial reading distance of two mountings of sensitive elements with respect to a coder according to the invention.

In relation with FIG. 6, the system for determining comprises two sensors of which the mountings 4, 4' are spaced by a distance e measured along the normal N to the transitions 3 by delivering respectively signals $V_{01}$, $V_{02}$ and $V'_{01}$, $V'_{02}$ in quadrature, the system further comprising a device for subtracting signals in order to form SIN, COS signals in quadrature.

Figure 7:
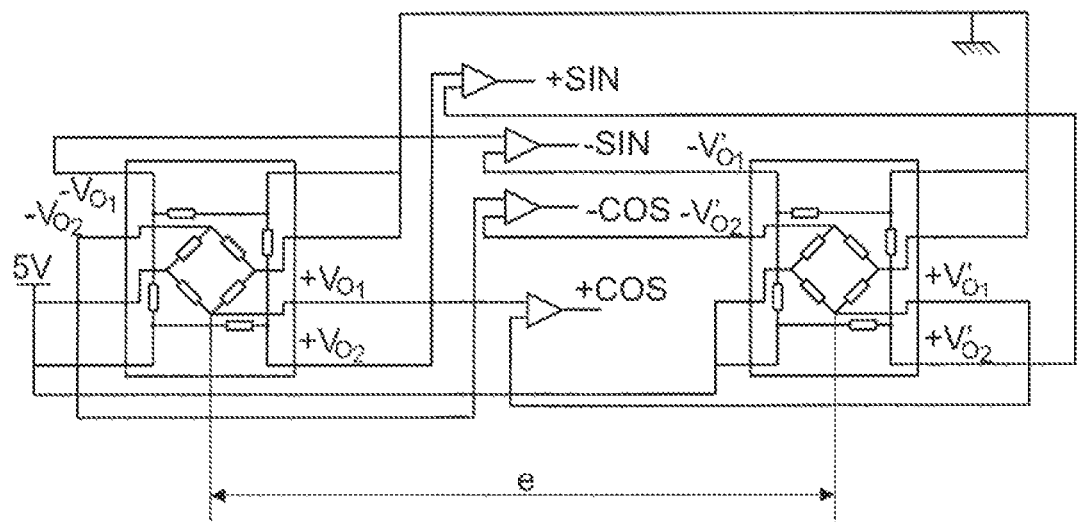
FIG. 7 is a diagram of the integration of the mountings of FIG. 6 in a device for subtracting.

FIG. 7 shows an embodiment in which the signals formed are:

SIN = (+SIN) − (−SIN);
+SIN being equal to $(+V_{01}) - (+V'_{01})$,
−SIN being equal to $(-V_{01}) - (-V'_{01})$;

COS = (+COS) − (−COS);
+COS being equal to $(+V_{02}) - (+V'_{02})$,
−COS being equal to $(-V_{02}) - (-V'_{02})$.

This embodiment allows for a filtering of the noise coming from the outside (for example from the motor or neighbouring interconnections). Indeed, if the magnetic field comprises an identical noise component on the different mountings 4, 4', the latter will be subtracted from the output signals SIN, COS.

By positioning the mountings 4, 4' at the magnetic phases respectively $\varphi_1$ and $\varphi_2$, i.e. by spacing them by a distance e measured along the normal N to the transitions 3 which is such that $$\varphi_1 - \varphi_2 = \frac{e}{2L_p} * 360,$$

the signals $V_1$=+COS or +SIN and $V_2$=−COS or −SIN delivered can be written:

$V_1(t) = G \cdot H_1 \cdot \sin(\omega t + \varphi_1) + G \cdot H_3 \cdot \sin(3\omega t + 3\varphi_1) + G \cdot H_5 \cdot \sin(5\omega t + 5\varphi_1) + \ldots$ $V_2(t) = G \cdot H_1 \cdot \sin(\omega t + \varphi_2) + G \cdot H_3 \cdot \sin(3\omega t + 3\varphi_2) + G \cdot H_5 \cdot \sin(5\omega t + 5\varphi_2) + \ldots$ G being the supposedly identical gain of the mountings 4, 4', ω being the speed of rotation, $H_i$ being the amplitude of the fundamental for i=1 and of the i-th order harmonics for i=3, 5, etc.

A subtractor circuit calculates the SIN or COS difference which is then written:

$V_1(t) - V_2(t) = G \cdot H_1 \cdot [\sin(\omega t + \varphi_1) - \sin(\omega t + \varphi_2)] +$ -continued
$G \cdot H_3 \cdot [\sin(3\omega t + 3\varphi_1) - \sin(3\omega t + 3\varphi_2)] +$ $G \cdot H_5 \cdot [\sin(5\omega t + 5\varphi_1) - \sin(5\omega t + 5\varphi_2)] + \ldots$ $= 2 \cdot G \cdot H_1 \cdot \sin(\frac{\varphi_1 - \varphi_2}{2}) \cdot \cos(\omega t + \frac{\varphi_1 + \varphi_2}{2}) +$ $2 \cdot G \cdot H_3 \cdot \sin(3 \cdot \frac{\varphi_1 - \varphi_2}{2}) \cdot \cos(3\omega t + 3 \cdot \frac{\varphi_1 + \varphi_2}{2}) +$ $2 \cdot G \cdot H_5 \cdot \sin(5 \cdot \frac{\varphi_1 - \varphi_2}{2}) \cdot \cos(5\omega t + 5 \cdot \frac{\varphi_1 + \varphi_2}{2}) + \ldots$ In relation with FIG. 6, $e=L_p$ modulo $2L_p$, i.e. the mountings are offset 180° modulo 360°, this difference is written:

$V_1(t) - V_2(t) = 2 \cdot G \cdot H_1 \cos(\omega t + \frac{\varphi_1 + \varphi_2}{2}) -$ $2 \cdot G \cdot H_3 \cdot \cos(3\omega t + 3 \cdot \frac{\varphi_1 + \varphi_2}{2}) + 2 \cdot G \cdot H_5 \cdot \cos(5\omega t + 5 \cdot \frac{\varphi_1 + \varphi_2}{2}) + \ldots$ It can be seen that the $3^{rd}$ and $5^{th}$ order harmonics are retained and have the same gain 2 as the fundamental after the subtraction operation.

In order to obtain a precise determination of the rotation parameter, it is sought to measure the filtered signal of at least the $3^{rd}$ order harmonic. However, any fixed compensation of the error generated by the harmonics is difficult to carry out, in that it depends on the measurement conditions (gap, position of the sensor). Moreover, a calibration is also difficult to consider for large volume and low cost application.

Figure 8:
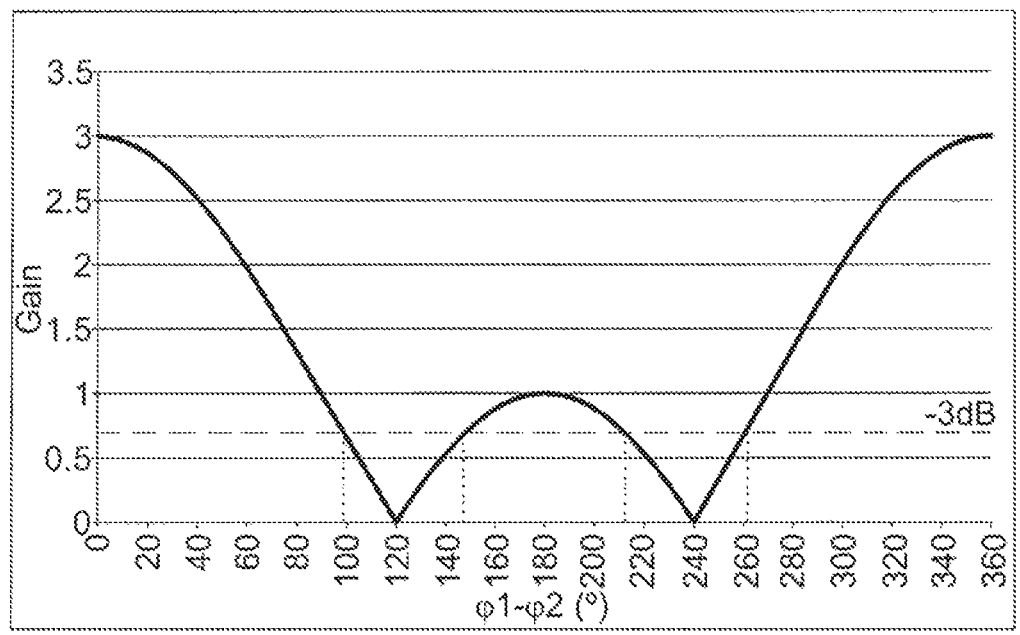
FIG. 8 is a curve showing the filtering of the $3^{rd}$ order harmonic according to the distance between the mountings of sensitive elements of the sensors.

FIG. 8 shows the filtering of the $3^{rd}$ order harmonic according to the value of the offset $\varphi_1$-$\varphi_2$.

When the distance e is substantially equal to $2/3L_p$ or $4/3L_p$ modulo $2L_p$, the difference is written:

$V_1(t) - V_2(t) = \sqrt{3} \cdot G \cdot H_1 \cos(\omega t + \frac{\varphi_1 + \varphi_2}{2}) +$ $0 - \sqrt{3} \cdot G \cdot H_5 \cdot \cos(5\omega t + 5 \cdot \frac{\varphi_1 + \varphi_2}{2}) + \ldots$ In this case, the $3^{rd}$ order harmonic is cancelled, the fundament and the $5^{th}$ order harmonic have a gain of 1.73 after the subtraction operation. A $3^{rd}$ order harmonic spatial filter was then carried out, while still retaining 86.5% of the fundamental.

Generally and in relation with FIG. 8, considering that the filter of the $3^{rd}$ order harmonic plays its role if it removes at least 3 dB from its value without filtering in relation to the amplitude of the fundamental, it is therefore required that:

$$\left| \frac{2 \cdot G \cdot H_3 \cdot \sin(3\frac{\varphi_1 - \varphi_2}{2})}{2 \cdot G \cdot H_1 \cdot \sin(\frac{\varphi_1 - \varphi_2}{2})} \right| \leq \frac{\sqrt{2}}{2} \cdot \left| \frac{H_3}{H_1} \right|$$

$$\Leftrightarrow \left| \frac{\sin(3\frac{\varphi_1 - \varphi_2}{2})}{\sin(\frac{\varphi_1 - \varphi_2}{2})} \right| \leq \frac{\sqrt{2}}{2}$$

$\Leftrightarrow \varphi_1 - \varphi_2 \in [99°; 148°]$ modulo 360° ou $\varphi_1 - \varphi_2 \in [212°; 261°]$ modulo 360°

Expressed in distance, in order to obtain a filtering of the $3^{rd}$ order harmonic, it is therefore required that the mountings 4, 4' are spaced by a distance e measured along the normal N to the transitions 3 which is such that:

$$0.55L_p < e < 0.82L_p, \text{ modulo } 2L_p; \text{ or}$$

$$1.18L_p < e < 1.45L_p, \text{ modulo } 2L_p.$$

The distance e between the mountings 4, 4' can vary within the ranges mentioned hereinabove in order to optimise the couple filtering—gain. Moreover, according to the space available, the mountings 4, 4' can be aligned along the normal N to the transitions 3, along the axis X or offset circumferentially (FIG. 6).

The suppression, or at least the attenuation, of the $3^{rd}$ order harmonic in the processed signals to determine the rotation parameter is beneficial relative to the precision of the determination, but also for the processing algorithms of the signal that carry out:

deletion of the offset of the signals;
balancing of the amplitudes of the signals;
phase correction between the signals.

What is claimed is:

1. A system for determining at least one rotation parameter of a rotating member, the system comprising:

a coder with a body having a cylindrical periphery with a radius around an axis of revolution (X), the periphery having an alternation of North and South magnetic poles of width l which are separated by transitions, each one of the transitions extending along an helix of pitch p and of angle □ to form a multipolar magnetic track which is able to emit a periodic magnetic field which is rotating in a plane perpendicular to the magnetic track and to the transitions, the track having $N_{pp}$ pairs of North and South poles and a polar width $L_p$ measured along a normal (N) to the transitions which are: $N_{pp} = \square a/l$ and $L_p = p \cdot \cos \square$;

at least one sensor able to detect the rotating magnetic field emitted by the coder by means of a mounting of at least two sensitive magnetic elements, the mounting being disposed at a radial reading distance from the magnetic track and being arranged to deliver signals ($V_{01}$, $V_{02}$, $V'_{01}$, $V'_{02}$) in quadrature;

wherein the system comprises two sensors of which the mountings are spaced by a distance e measured along the normal (N) to the transitions by delivering respectively signals ($V_{01}$, $V_{02}$, $V'_{01}$, $V'_{02}$) in quadrature, the system further comprising a circuit for subtracting the signals in order to form signals (SIN, COS) in quadrature.

2. The system according to claim 1, wherein the mounting comprises two Wheatstone bridge circuits of four sensitive elements, the circuits being disposed in a plane perpendicular to the magnetic track as to detect the magnetic field rotating in the plane which is emitted by the track.

3. The system according to claim 1, wherein each sensitive element comprises at least one pattern with a tunnel magneto resistance material base of which the resistance varies according to the magnetic field detected.

4. The system according to claim 1, wherein the distance e: $e = L_p$ modulo $2L_p$.

5. The system according to claim 1, wherein the distance e:

$$0.55L_p < e < 0.82L_p, \text{ modulo } 2L_p; \text{ or}$$

$$1.18L_p < e < 1.45L_p, \text{ modulo } 2L_p.$$

6. The system according to claim 5, wherein the distance e is substantially equal to $2/3L_p$ or $4/3L_p$ modulo $2L_p$.

* * * * *